(12) United States Patent
Uchida

(10) Patent No.: US 10,658,466 B2
(45) Date of Patent: May 19, 2020

(54) SEMICONDUCTOR ELEMENT AND METHOD OF MANUFACTURING THE SAME

(71) Applicant: Panasonic Intellectual Property Management Co., Ltd., Osaka (JP)

(72) Inventor: Masao Uchida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/260,721

(22) Filed: Jan. 29, 2019

(65) Prior Publication Data
US 2019/0245043 A1     Aug. 8, 2019

(30) Foreign Application Priority Data

Feb. 6, 2018  (JP) .................................. 2018-019031

(51) Int. Cl.
| | |
|---|---|
| *H01L 29/16* | (2006.01) |
| *H01L 29/06* | (2006.01) |
| *H01L 29/24* | (2006.01) |
| *H01L 29/08* | (2006.01) |
| *H01L 29/66* | (2006.01) |
| *H01L 29/872* | (2006.01) |

(52) U.S. Cl.
CPC ...... *H01L 29/1608* (2013.01); *H01L 29/0619* (2013.01); *H01L 29/0692* (2013.01); *H01L 29/08* (2013.01); *H01L 29/24* (2013.01); *H01L 29/6606* (2013.01); *H01L 29/66143* (2013.01); *H01L 29/66212* (2013.01); *H01L 29/66969* (2013.01); *H01L 29/872* (2013.01)

(58) Field of Classification Search
CPC .................................................. H01L 29/0619
See application file for complete search history.

(56) References Cited

U.S. PATENT DOCUMENTS

| | | | | |
|---|---|---|---|---|
| 2012/0228636 | A1* | 9/2012 | Maeyama | ........... H01L 29/0619 257/77 |
| 2016/0372609 | A1* | 12/2016 | Kiyama | ................ H01L 29/872 |
| 2017/0263697 | A1* | 9/2017 | Maeyama | ........... H01L 29/6606 |

FOREIGN PATENT DOCUMENTS

JP         6030806 B        11/2016

* cited by examiner

*Primary Examiner* — Thao P Le
(74) *Attorney, Agent, or Firm* — McDermott Will & Emery LLP

(57) ABSTRACT

A semiconductor element includes: a semiconductor substrate of a first conduction type; a silicon carbide semiconductor layer of the first conduction type disposed above a principal surface of the semiconductor substrate; a terminal edge region of a second conduction type disposed in the silicon carbide semiconductor layer; an insulating film; a first electrode disposed on the silicon carbide semiconductor layer; and a seal ring surrounding the first electrode. The terminal edge region is disposed to surround part of a surface of the silicon carbide semiconductor layer when viewed in a normal direction of the principal surface of the semiconductor substrate. The terminal edge region includes a guard ring region of the second conduction type, and a terminal edge injection region of the second conduction type. The seal ring is formed on the terminal edge injection region through an opening disposed on the insulating film.

21 Claims, 12 Drawing Sheets

SEMICONDUCTOR ELEMENT AND METHOD OF MANUFACTURING THE SAME

BACKGROUND

1. Technical Field

The present disclosure relates to a semiconductor element and a method of manufacturing the same.

2. Description of the Related Art

Silicon carbide (SiC) is a semiconductor material having a larger bandgap and higher hardness as compared to silicon (Si). SiC is used in semiconductor elements such as a switching element and a rectifier element. A semiconductor element using SiC has advantage in, for example, reduction of an electrical power loss as compared to a semiconductor element using Si.

Typical semiconductor elements using SiC are a metal-insulator-semiconductor field-effect transistor (MISFET) and a Schottky-barrier diode (SBD). A metal-oxide-semiconductor field-effect transistor (MOSFET) is a kind of MISFET. A junction-barrier Schottky diode (JBS) is a kind of SBD.

A semiconductor element using SiC (hereinafter referred to as "SiC semiconductor element") includes a semiconductor substrate, and a semiconductor layer formed of SiC disposed on a principal surface of the semiconductor substrate. An electrode as a front face electrode electrically connected with an element external is disposed above the semiconductor layer. A terminal edge structure for electric field reduction is provided to the semiconductor layer at or around a terminal edge of the SiC semiconductor element. In addition, an annular layer is formed on the principal surface at an end part of the semiconductor layer to increase humidity resistance in some configurations (refer to PTL 1).

CITATION LIST

Patent Literature

PTL 1: JP06030806B1

SUMMARY

An aspect of the present disclosure provides a semiconductor element having high breakdown voltage and high humidity resistant performance.

To solve the above-described problem, a semiconductor element according to an aspect of the present disclosure has a configuration as follows. Specifically, the semiconductor element includes: a semiconductor substrate of a first conduction type; a silicon carbide semiconductor layer of the first conduction type; a terminal edge region of a second conduction type; an insulating film; a first electrode; a second electrode; and a seal ring. The semiconductor substrate has a principal surface and a back surface. The silicon carbide semiconductor layer is disposed above the principal surface of the semiconductor substrate. The terminal edge region of the second conduction type is disposed in the silicon carbide semiconductor layer. The insulating film covers at least part of the terminal edge region. The first electrode is disposed on the silicon carbide semiconductor layer to form a Schottky contact with the silicon carbide semiconductor layer. The second electrode is disposed on the back surface of the semiconductor substrate to form an ohmic contact with the semiconductor substrate. The seal ring is disposed above the silicon carbide semiconductor layer to surround the first electrode. The terminal edge region is disposed to surround part of a surface of the silicon carbide semiconductor layer when viewed in a normal direction of the principal surface of the semiconductor substrate. The terminal edge region includes a guard ring region of the second conduction type contacting the surface of the silicon carbide semiconductor layer, and a terminal edge injection region of the second conduction type disposed to surround the guard ring region separately from the guard ring region. The first electrode has a surface contacting the silicon carbide semiconductor layer. The first electrode contacts the guard ring region at an edge part of the surface contacting the silicon carbide semiconductor layer. The seal ring is formed on the terminal edge injection region through an opening disposed on the insulating film.

According to an aspect of the present disclosure, a semiconductor element having high breakdown voltage and high humidity resistant performance is provided.

DETAILED DESCRIPTION

Figure 1:
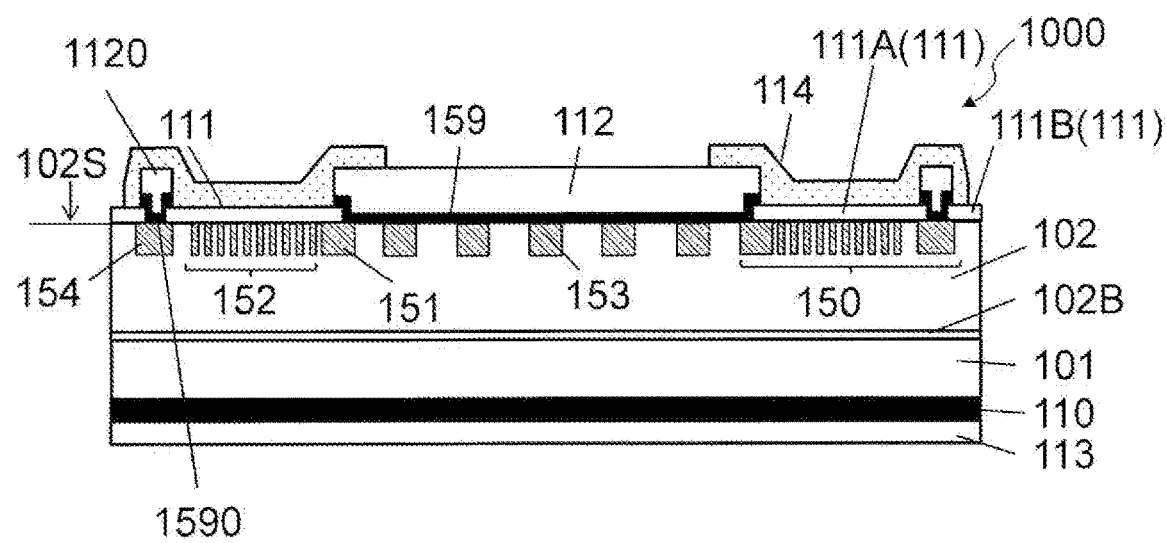
FIG. 1 is a diagram illustrating a section of a semiconductor element according to an exemplary embodiment of the present disclosure.

A high reliable semiconductor element having high breakdown voltage and durability in large current use has been desired. However, the conventional SiC semiconductor element disclosed in PTL 1 has insufficient humidity resistant performance in some cases.

The inventor of the present invention has thought of a semiconductor element and a method of manufacturing the same according to the following aspects based on the above discussion.

A semiconductor element according to an aspect of the present disclosure has a configuration as follows. Specifically, the semiconductor element includes: a semiconductor substrate of a first conduction type; a silicon carbide semiconductor layer of the first conduction type; a terminal edge region of a second conduction type; an insulating film; a first electrode; a second electrode; and a seal ring. The semiconductor substrate has a principal surface and a back surface. The silicon carbide semiconductor layer is disposed above the principal surface of the semiconductor substrate. The terminal edge region of the second conduction type is disposed in the silicon carbide semiconductor layer. The insulating film covers at least part of the terminal edge region. The first electrode is disposed on the silicon carbide semiconductor layer to form a Schottky contact with the silicon carbide semiconductor layer. The second electrode is disposed on the back surface of the semiconductor substrate to form an ohmic contact with the semiconductor substrate. The seal ring is disposed above the silicon carbide semiconductor layer to surround the first electrode. The terminal edge region is disposed to surround part of a surface of the silicon carbide semiconductor layer when viewed in a normal direction of the principal surface of the semiconductor substrate. The terminal edge region includes a guard ring region of the second conduction type contacting the surface of the silicon carbide semiconductor layer, and a terminal edge injection region of the second conduction type disposed to surround the guard ring region separately from the guard ring region. The first electrode has a surface contacting the silicon carbide semiconductor layer. The first electrode contacts the guard ring region at an edge part of the surface contacting the silicon carbide semiconductor layer. The seal ring is formed on the terminal edge injection region through an opening disposed on the insulating film.

A width of the seal ring at the opening may be smaller than a width of the terminal edge injection region in a direction pointing from a center to an edge on a plane of the semiconductor substrate.

The seal ring may include a conductive film, and the seal ring may be connected with the terminal edge injection region through the conductive film.

The terminal edge injection region may be disposed entirely in a region with which the conductive film contacts on the surface of the silicon carbide semiconductor layer.

The seal ring may contact the terminal edge injection region.

The terminal edge injection region may be disposed entirely in a region with which the seal ring contacts on the surface of the silicon carbide semiconductor layer.

The conductive film may have a configuration same as a configuration of the first electrode.

The semiconductor element may further include a front face electrode disposed on the first electrode.

The front face electrode may have a configuration same as a configuration of the guard ring.

The terminal edge region may further include an FLR region between the guard ring region and the terminal edge injection region, and the FLR region may include a plurality of rings of the second conduction type disposed to surround the guard ring region separately from the guard ring region.

The FLR region may be disposed separately from the terminal edge injection region.

The guard ring region, the FLR region, and the terminal edge injection region may have an identical concentration profile in a direction perpendicular to the principal surface of the semiconductor substrate.

Concentration of impurities of the second conduction type in the silicon carbide semiconductor layer may be more than or equal to $1 \times 10^{20}$ cm$^{-3}$ in the guard ring region, the FLR region, and the terminal edge injection region.

The semiconductor element may further include a barrier region of the second conduction type disposed on the surface of the silicon carbide semiconductor layer inside the guard ring region.

The semiconductor element may further include a barrier region of the second conduction type disposed on the surface of the silicon carbide semiconductor layer inside the guard ring region, and the barrier region, the guard ring region, the FLR region, and the terminal edge injection region may have an identical concentration profile in a direction perpendicular to the principal surface of the semiconductor substrate.

Concentration of impurities of the second conduction type in the silicon carbide semiconductor layer may be more than or equal to $1 \times 10^{20}$ cm$^{-3}$ in the barrier region, the guard ring region, the FLR region, and the terminal edge injection region.

A method of manufacturing a semiconductor element according to an aspect of the present disclosure includes processes as follows. Specifically, the method includes preparing a semiconductor substrate of a first conduction type having a principal surface and a back surface. The method includes forming a silicon carbide semiconductor layer of a first conduction type disposed above a principal surface of the semiconductor substrate. The method includes forming a terminal edge region of a second conduction type disposed in the silicon carbide semiconductor layer. The method includes forming an insulating film covering at least part of the terminal edge region. The method includes forming a first electrode disposed on the silicon carbide semiconductor layer to form a Schottky contact with the silicon carbide semiconductor layer. The method includes forming a second electrode disposed on the back surface of the semiconductor substrate and functioning as an ohmic contact with the semiconductor substrate. The method includes forming a seal ring disposed above the silicon carbide semiconductor layer to surround the first electrode. The terminal edge region is disposed to surround part of the silicon carbide semiconductor layer surface when viewed in a normal direction of the principal surface of the semiconductor substrate. The terminal edge region includes a guard ring region of the second conduction type contacting the surface of the silicon carbide semiconductor layer, and a terminal edge injection region of the second conduction type disposed to surround the guard ring region separately from the guard ring region. The first electrode has a surface contacting the silicon carbide semiconductor layer. The first electrode contacts the guard ring region at an edge part of the surface contacting the silicon carbide semiconductor layer. The seal ring is formed on the terminal edge injection region through an opening formed on the insulating film. The guard ring region and the terminal edge injection region are formed through an identical process.

The method may further include forming an FLR region disposed between the guard ring region and the terminal edge injection region and including a plurality of rings of the second conduction type disposed to surround the guard ring region separately from the guard ring region, and the guard ring region, the FLR region, and the terminal edge injection region may be formed through an identical process.

The method may further include forming a barrier region of the second conduction type disposed on the surface of the silicon carbide semiconductor layer inside the guard ring region, and the barrier region, the guard ring region, the FLR region, and the terminal edge injection region may be formed through an identical process.

The seal ring may be indirectly connected with the terminal edge injection region through a conductive film, and the conductive film may be formed through a process identical to a process through which the first electrode is formed.

The method may further include forming a front face electrode disposed on the first electrode, and the front face electrode may be formed through a process identical to a process through which the seal ring is formed.

The following describes a specific exemplary embodiment of the present disclosure. However, redundantly detailed description will be omitted in some cases. For example, detailed description of an already well-known matter and duplicate description of configurations identical to each other in effect will be omitted in some cases. This avoids unnecessary redundancy of the following description to facilitate understanding of the skilled person in the art. The inventor provides the accompanying drawings and the following description for sufficient understanding of the present disclosure by the skilled person in the art, and these drawings and description are not intended to limit a subject matter described in the claims In the following description, components having functions identical or similar to each other are denoted by an identical reference sign.

Exemplary Embodiment

The following describes a semiconductor element according to the exemplary embodiment of the present disclosure with reference to the accompanying drawings. The present exemplary embodiment describes an example in which the first conduction type is the n type, and the second conduction type is the p type, but the present invention is not limited thereto. In the exemplary embodiment of the present disclosure, the first conduction type may be the p type, and the second conduction type may be the n type.

Structure of Semiconductor Element

The following describes semiconductor element 1000 according to the present exemplary embodiment with reference to FIGS. 1 to 13.

Figure 2:
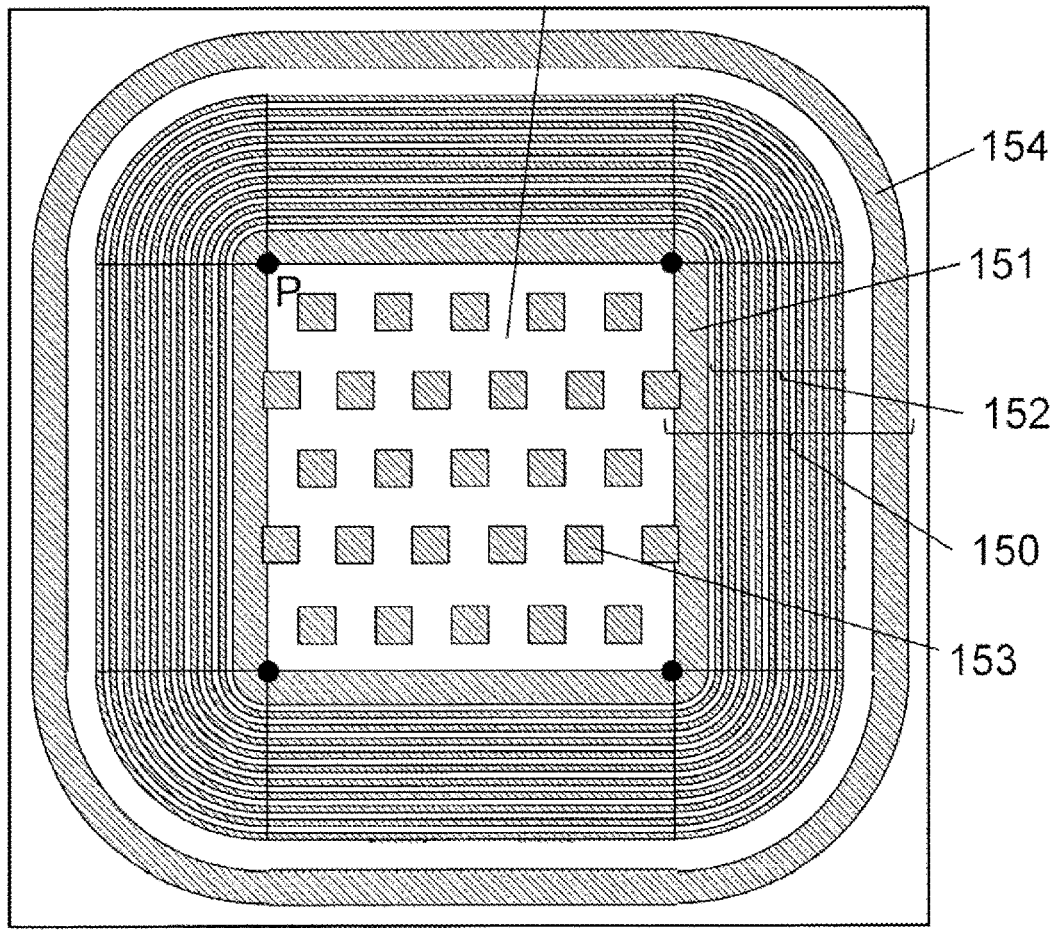
FIG. 2 is a plan view of a terminal edge region and a barrier region formed on drift layer 102 in the semiconductor element according to the exemplary embodiment of the present disclosure.

FIGS. 1 and 2 are a cross-sectional view and a plan view, respectively, for schematic description of semiconductor element 1000 according to the present exemplary embodiment. Semiconductor element 1000 includes semiconductor substrate 101 of the first conduction type, and drift layer 102 as a silicon carbide semiconductor layer of the first conduction type disposed above a principal surface of semiconductor substrate 101. In an example illustrated in FIG. 1, semiconductor element 1000 includes buffer layer 102B between drift layer 102 and semiconductor substrate 101. Buffer layer 102B may be omitted. Terminal edge region 150 of the second conduction type is disposed in drift layer 102. Terminal edge region 150 of the second conduction type includes guard ring region 151, field limiting ring (FLR) region 152 including a plurality of rings surrounding guard ring region 151, and terminal edge injection region 154.

First electrode 159 is disposed on drift layer 102. First electrode 159 forms a Schottky contact with drift layer 102. First electrode 159 contacts guard ring region 151 at an edge part of a surface contacting drift layer 102 as a silicon carbide semiconductor layer. First electrode 159 may be only a metallic material contacting guard ring region 151. Guard ring region 151 may form a non-ohmic contact with first electrode 159. Front face electrode 112 is disposed on a surface of first electrode 159.

Insulating film 111 is disposed on part of surface 102S of drift layer 102. Insulating film 111 covers part of terminal edge region 150. Part of first electrode 159 may cover insulating film 111. Passivation film 114 is disposed to cover part of insulating film 111. Passivation film 114 may cover part of front face electrode 112.

A plurality of barrier regions 153 of the second conduction type may be disposed in a region positioned inside terminal edge region 150 on drift layer 102 when viewed in a normal direction of semiconductor substrate 101. The formation of barrier regions 153 can reduce Schottky leakage current when reverse bias is applied to the Schottky contact formed by first electrode 159 and drift layer 102. Barrier regions 153 are formed on a surface 102S side of drift layer 102. Barrier regions 153 may contact first electrode 159 on surface 102S of drift layer 102.

Seal ring 1120 is disposed at an end part on surface 102S of drift layer 102. Barrier metal 1590 may be disposed below seal ring 1120. Seal ring 1120 or barrier metal 1590 contacts terminal edge injection region 154 of the second conduction type through an opening of insulating film 111 on surface 102S of drift layer 102. A width of contact of seal ring 1120 or barrier metal 1590 with surface 102S of drift layer 102 is designed to be smaller than a width of terminal edge injection region 154 in a direction pointing from a substrate center to an end part on semiconductor substrate 101. In other words, a plane on which seal ring 1120 or barrier metal 1590 contacts surface 102S of drift layer 102 is entirely positioned on terminal edge injection region 154.

Second electrode 110 is disposed on a back surface as a surface facing to the principal surface of semiconductor substrate 101. Second electrode 110 forms an ohmic contact with semiconductor substrate 101. Back face electrode 113 is disposed on a lower surface of second electrode 110, in other words, a surface on a side opposite to semiconductor substrate 101. Although not illustrated, an injection region of the first conduction type may be formed on the back surface of semiconductor substrate 101 to reduce contact resistance of the ohmic contact between the back surface of semiconductor substrate 101 and second electrode 110.

As illustrated in FIG. 1, terminal edge region 150 may include guard ring region 151 of the second conduction type contacting part of first electrode 159, FLR region 152 as a floating region including a plurality of rings of the second conduction type disposed to surround guard ring region 151, and terminal edge injection region 154. FLR region 152 is disposed not to contact guard ring region 151. Terminal edge region 150 only needs to include at least one region disposed to surround part of a surface of drift layer 102 and is not limited to the exemplarily illustrated configuration. For example, a junction termination extension (JTE) region in which a concentration of impurities of the second conduction type changes in an in-plane direction of semiconductor substrate 101 may be formed as terminal edge region 150.

FIG. 2 illustrates a configuration of surface 102S of drift layer 102 of semiconductor element 1000 in plane view. For simplification of description, any structure on surface 102S of drift layer 102 is not illustrated in FIG. 2. Inside of terminal edge region 150 is effective region 102A. Current flows through effective region 102A on surface 102S of drift layer 102. In the configuration including barrier regions 153 as illustrated in FIG. 2, forward current of semiconductor element 1000 selectively flows through effective region 102A except for regions in which barrier regions 153 are disposed. However, when relatively large forward voltage as compared to voltage applied to the second electrode is applied to the first electrode, forward current may flow through barrier regions 153.

When negative voltage with respect to second electrode 110 in semiconductor element 1000 is applied to first electrode 159, breakdown voltage decreases due to concentration of high electric field in semiconductor element 1000 in some cases. Terminal edge region 150 is provided to reduce this breakdown voltage decrease. Terminal edge region 150 is disposed to have curvature at each corner of semiconductor element 1000 as illustrated in FIG. 2. Terminal edge region 150 can be formed with, for example, at least two straight regions shaped straight on inner and outer peripheries, and a fan shape region having a curved shape. The fan shape region is disposed to connect end parts of the at least two straight regions. In this example, the inner and outer peripheries of each straight region only have straight shapes, but may have partially non-straight shapes. The two regions connected with the fan shape region may have non-straight shapes. For example, the inner and outer peripheries may be each formed by a curved line having a curvature larger than a curvature of the fan shape region.

In the example illustrated in FIG. 2, inner and outer peripheries of terminal edge injection region 154, inner and outer peripheries of each ring in FLR region 152, and an outer periphery of guard ring region 151 have an identical curvature center P in terminal edge region 150 disposed at each corner of semiconductor element 1000.

Figure 23:
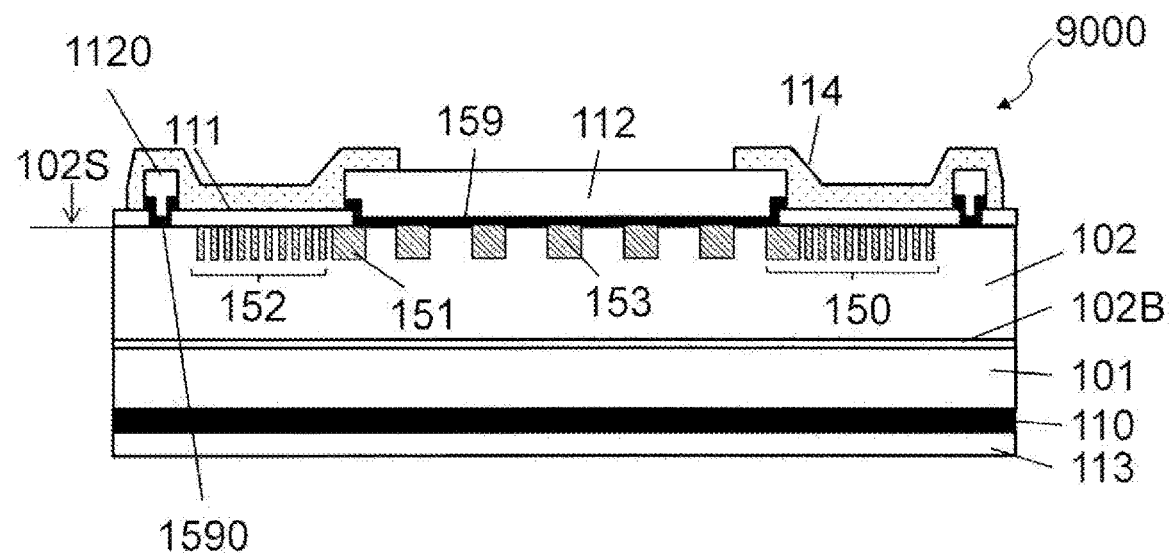
FIG. 23 is a diagram illustrating a section of the conventional semiconductor element.
Figure 24:
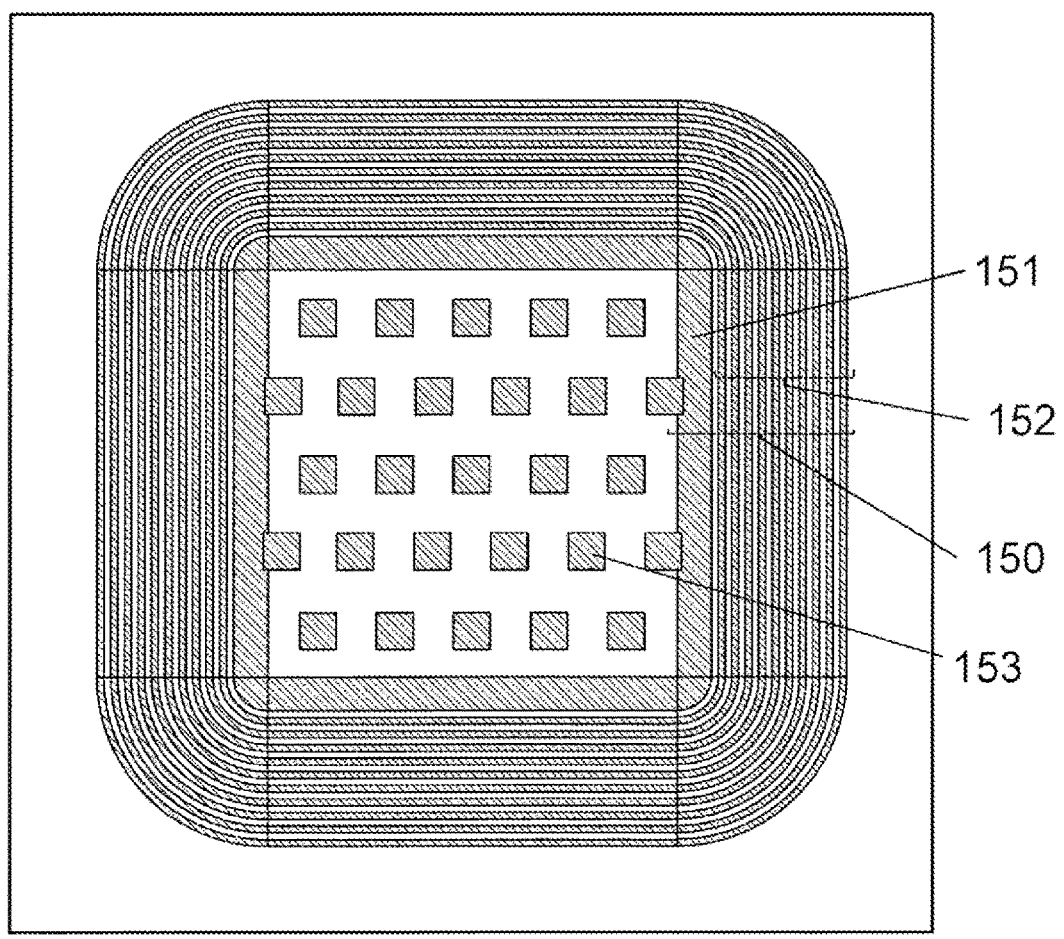
FIG. 24 is a plan view of a terminal edge region and a barrier region formed on a drift layer in the conventional semiconductor element.

The inventor of the present invention assembled each of semiconductor element 1000 according to the present disclosure and conventional semiconductor element 9000 produced as a comparative example into a typical package (TO-247), and performed a stress test on the semiconductor element. FIGS. 23 and 24 illustrate configurations of a section and a plane of conventional semiconductor element 9000, respectively. Existence of terminal edge injection region 154 is different from the example illustrated in FIGS. 1 and 2.

Figure 3:
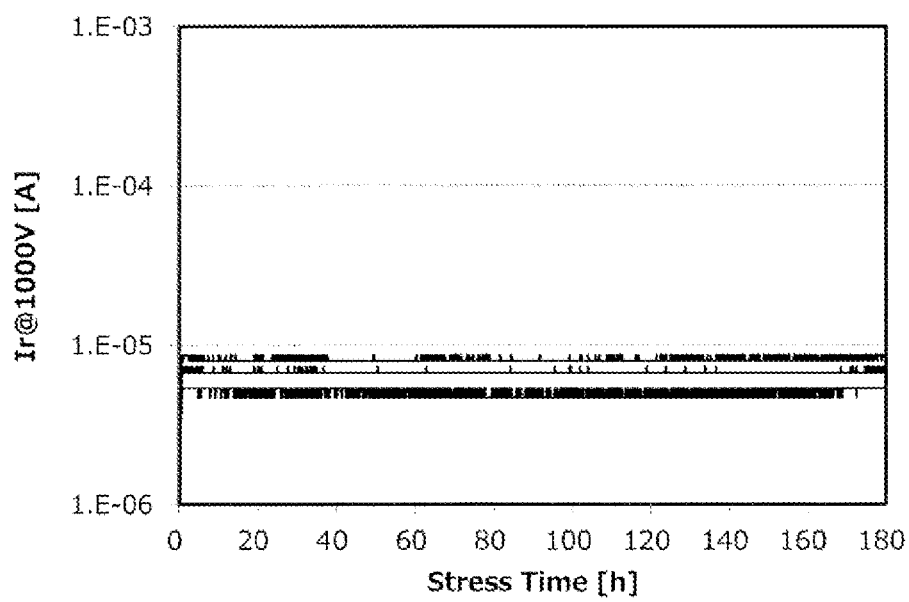
FIG. 3 is a diagram illustrating a result of a highly-accelerated temperature and humidity stress test on the semiconductor element according to the exemplary embodiment of the present disclosure.
Figure 4:
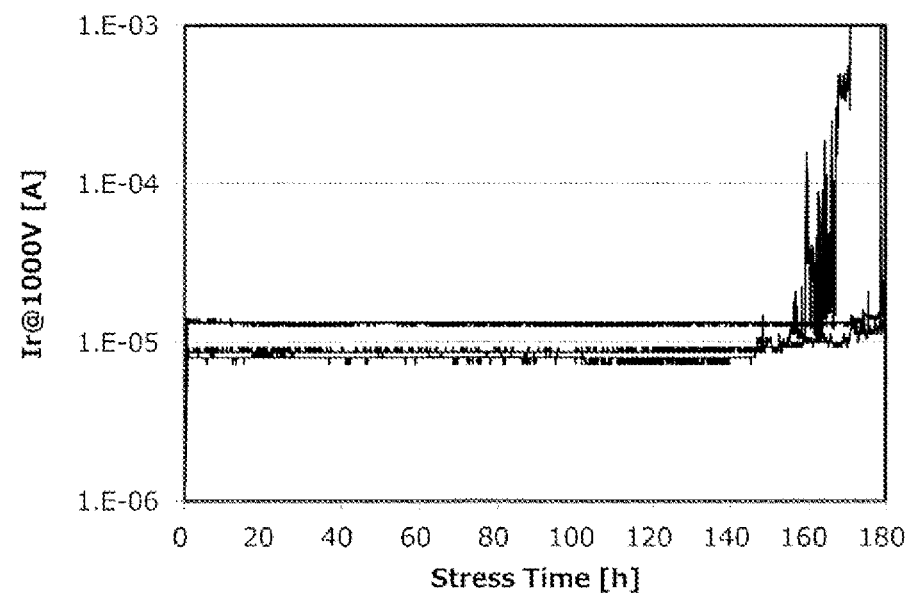
FIG. 4 is a diagram of a comparative example illustrating a result of a highly-accelerated temperature and humidity stress test on a conventional semiconductor element.

FIGS. 3 and 4 illustrate results of the highly-accelerated temperature and humidity stress test (HAST). The inventor of the present invention performed the stress test by applying negative voltage of 1000 V with respect to back face electrode 113 to front face electrode 112 at a temperature of 130° C. and a relative humidity of 85%. The inventor of the present invention prepared three elements of each of semiconductor element 1000 according to the present disclosure and conventional semiconductor element 9000, and acquired the results illustrated in FIGS. 3 and 4 by constantly monitoring backward leakage current flowing between front face electrode 112 and back face electrode 113. In graphs in FIGS. 3 and 4, the horizontal axis represents a time (in units of hours (h)) ("Stress Time [h]") in which the stress test was performed, and the vertical axis represents a value (units of A) (Ir @1000 V [A]) of the backward leakage current when the negative voltage of 1000 V was applied. The vertical axis is in a logarithmic scale, and symbol E represents powers of 10. For example, 1.E-05 represents $1 \times 10^{-5}$.

In an example illustrated in FIG. 3, leakage current in semiconductor element 1000 according to the present disclosure in an initial state at start of the stress test was less than or equal to 10 μA for any prepared element. Thereafter, the initial leakage current hardly changed after 180 hours have elapsed.

In an example illustrated in FIG. 4, leakage current in conventional semiconductor element 9000 as the comparative example in an initial state at start of the stress test was more than or equal to 10 μA for one prepared element, and less than or equal to 10 μA for two prepared elements. The initial leakage current hardly changed in the one element from the initial value after 180 hours have elapsed. However, the leakage current changed in the two elements after 140 hours elapsed. The leakage current extremely increased in one of the two elements after 160 hours elapsed, and the element was broken down. The leakage current was maximized in the other element right before 180 hours elapsed, and the element was broken down.

In the stress test in 180 hours, all of the three elements of semiconductor element 1000 according to the present disclosure were not broken down, but two of the three elements of conventional semiconductor element 9000 were broken down. This indicates that semiconductor element 1000 according to the present disclosure had humidity resistant performance more excellent than humidity resistant performance of conventional semiconductor element 9000.

Protection of terminal edge region 150 from disturbance is important to improve the humidity resistant performance of the semiconductor element. Thus, insulating film 111, passivation film 114, and seal ring 1120 are disposed to cover terminal edge region 150.

The seal ring improves the humidity resistant performance for various reasons. For example, semiconductor elements 1000 and 9000 are each produced by cutting a semiconductor wafer into rectangular shapes through dicing. At the dicing, a significant load is applied to an end part of the semiconductor element. As a result, cracks occur to an end part of insulating film 111. In this case, for example, water or impurities enter through the cracks at the end part of the semiconductor element. The entry of, for example, water or impurities degrades the breakdown voltage of the semiconductor element, and increases the leakage current in some cases. However, in semiconductor element 1000, inside 111A and outside 111B of insulating film 111 are divided by seal ring 1120. Thus, when a crack occurs to insulating film 111 at the dicing, the crack is prevented from expanding to inside 111A of insulating film 111 by seal ring 1120. In this manner, seal ring 1120 can reduce breakdown voltage degradation and leakage current increase due to the entry of water or impurities to the crack of insulating film 111.

However, water or impurities potentially enter not only from the end part of the semiconductor element but also from the surface of the semiconductor element. Passivation film 114 and insulating film 111 are disposed to reduce their entry. However, in a long period, water or impurities potentially reach a vicinity of terminal edge region 150, thereby degrading the humidity resistant performance. Instead of water or impurities entering from outside, for example, impurities or ions contained in passivation film 114 and insulating film 111 as well as impurities, ions, or charged particles trapped at an interface between passivation film 114 and insulating film 111 and an interface between insulating film 111 and drift layer 102 can be moved by an electric field in the semiconductor element in operation. Accordingly, the humidity resistant performance of the semiconductor element potentially degrades.

The inventor of the present invention has found that the humidity resistant performance is improved by providing potential different from potential of drift layer 102 to seal ring 1120 to change behavior of water or impurities affecting the vicinity of terminal edge region 150. Specifically, as illustrated in a configuration of semiconductor element 1000 according to the present disclosure, terminal edge injection region 154 of the second conduction type is formed on surface 102S of drift layer 102 of the first conduction type, and conductive seal ring 1120 is disposed within terminal edge injection region 154. Accordingly, drift layer 102 of the first conduction type and seal ring 1120 are separated from each other through terminal edge injection region 154 of the second conduction type. In other words, seal ring 1120 does not contact a region in which terminal edge injection region 154 of the second conduction type is not formed on drift layer 102 of the first conduction type.

Potential of terminal edge injection region 154 of the second conduction type is increased by a pn junction between drift layer 102 of the first conduction type and terminal edge injection region 154 of the second conduction type. Potential of seal ring 1120 directly or indirectly contacting terminal edge injection region 154 of the second conduction type is increased, too. Accordingly, a potential difference between seal ring 1120 and drift layer 102 increases as compared to a configuration in which seal ring 1120 directly contacts drift layer 102. This leads to decrease of a potential difference between first electrode 159 and seal ring 1120. In other words, strength of an electric field generated between first electrode 159 and seal ring 1120 decreases. This results in reduction of movement of, for example, water, impurities, or ions contained in passivation film 114 and insulating film 111 as well as water, impurities, ions, or charged particles trapped at the interface between passivation film 114 and insulating film 111 and the interface between insulating film 111 and drift layer 102. Accordingly, degradation of the humidity resistant performance can be further reduced. In other words, the separation between drift layer 102 of the first conduction type and seal ring 1120 through terminal edge injection region 154 of the second conduction type improves the humidity resistant performance of semiconductor element 1000.

Description of barrier metal 1590 is omitted above. Conductive barrier metal 1590 does not reduce increase of the above-described potential difference. Thus, barrier metal 1590 may be disposed or not depending on a manufacturing purpose.

Method of Manufacturing Semiconductor Element

The following describes a method of manufacturing semiconductor element 1000 according to the present exemplary embodiment with reference to FIGS. 5 to 13. FIGS. 5 to 13 are each a cross-sectional view illustrating part of the method of manufacturing semiconductor element 1000 according to the present exemplary embodiment.

First, semiconductor substrate 101 is prepared. Semiconductor substrate 101 is made of, for example, low resistive 4H-SiC (0001) of the first conduction type (n type) having a resistivity of 0.02 Ωcm approximately, and is obtained through off-cut at, for example, 4 degrees in a <11-20> direction.

Figure 5:
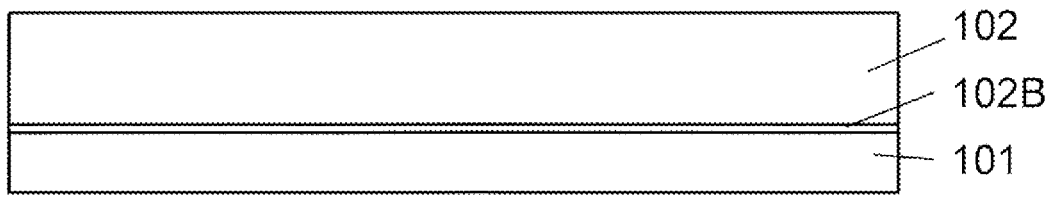
FIG. 5 is a sectional pattern diagram illustrating a method of manufacturing the semiconductor element according to the exemplary embodiment of the present disclosure.

As illustrated in FIG. 5, high resistant drift layer 102 of the n type is formed on semiconductor substrate 101 by epitaxial growth. Before the formation of drift layer 102, buffer layer 102B containing SiC of the n type having a high impurity concentration may be deposited on semiconductor substrate 101. The buffer layer has, for example, an impurity concentration of $1 \times 10^{18}$ cm$^{-3}$, and a thickness of 1 μm. Drift layer 102 is made of, for example, 4H-SiC of the n type and has, for example, an impurity concentration of $1 \times 10^{16}$ cm$^{-3}$ and a thickness of 11 μm. The impurity concentration and the thickness are selected as appropriate to achieve a necessary breakdown voltage. Thus, the impurity concentration and the thickness are not limited to these values.

Figure 6:
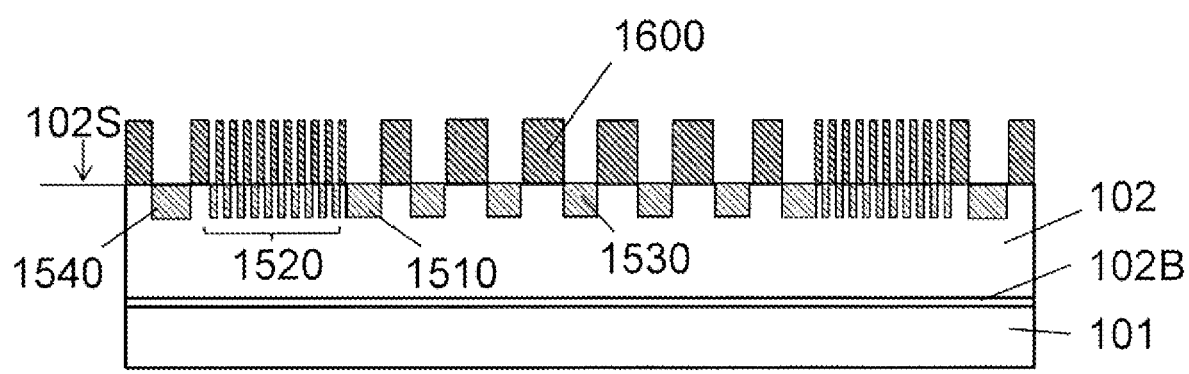
FIG. 6 is a sectional pattern diagram illustrating the method of manufacturing the semiconductor element according to the exemplary embodiment of the present disclosure.

Subsequently, as illustrated in FIG. 6, mask 1600 made of, for example, SiO$_2$ is formed on drift layer 102, and then, for example, Al ions are injected into drift layer 102. Accordingly, ion implantation regions 1510 and 1520 are formed in drift layer 102. Ion implantation regions 1510 and 1520 are to become guard ring region 151 and FLR region 152, respectively, later. Simultaneously, ion implantation region 1540 to become terminal edge injection region 154 later, and ion implantation region 1530 to become barrier regions 153 later may be formed. It is only needed to form openings of mask 1600 at corresponding parts where ion implantation regions 1530 and 1540 are desired to be formed. Accordingly, ion implantation regions 1530 and 1540 can be formed simultaneously with ion implantation regions 1510 and 1520. This eliminates need to provide another redundant process for forming terminal edge injection region 154. This results in a simplified manufacturing process.

In this case, ion implantation regions 1510, 1520, 1530, and 1540 have an identical concentration profile in a direction perpendicular to surface 102S of drift layer 102. Barrier regions 153 does not necessarily need to be provided. Barrier regions 153 may be disposed as appropriate in accordance with necessity for reduction of the leakage current in semiconductor element 1000. The concentration profile means concentration distribution.

Although not illustrated, the concentration of the first conduction type on the back surface side of semiconductor substrate 101 may be further increased as necessary by injecting impurities of the first conduction type such as phosphorus or nitrogen to the back surface side.

Figure 7:
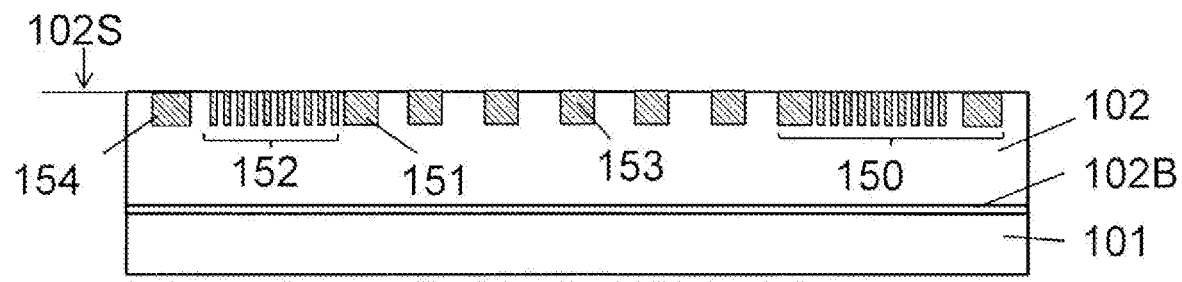
FIG. 7 is a sectional pattern diagram illustrating the method of manufacturing the semiconductor element according to the exemplary embodiment of the present disclosure.

Subsequently, as illustrated in FIG. 7, mask 1600 is removed, and then guard ring region 151, FLR region 152, barrier regions 153, and terminal edge injection region 154 of the second conduction type, in other words, the p type are formed from ion implantation regions 1510, 1520, 1530, and 1540, respectively, through thermal processing at a temperature of 1500° C. to 1900° C. approximately. In this case, the concentration of impurities of the second conduction type may be more than or equal to $1 \times 10^{20}$ $cm^{-3}$. Such high concentration of impurities of the second conduction type reduces a width of a depleted layer generated between barrier regions 153 and the first electrode formed on a surface of barrier regions 153, and a width of a depleted layer generated between terminal edge injection region 154 and the seal ring or the barrier metal formed on a surface of terminal edge injection region 154. As a result, contact resistance can be lowered. A carbon film may be deposited on the surface of drift layer 102 before the thermal processing and removed after the thermal processing. Thereafter, a thermally oxidized film may be formed on the surface of drift layer 102 and then removed by etching to clean the surface of drift layer 102.

In the example illustrated in FIG. 1, guard ring region 151 has, for example, a width of 15 μm in an in-plane direction of surface 102S of drift layer 102. FLR region 152 includes the plurality of rings, in other words, FLRs to surround guard ring region 151. The injection region for forming the plurality of FLRs has, for example, a width of 1 μm to 2 μm and an interval of 0.7 μm to 5 μm approximately. The FLR width and the interval between the FLRs may be fixed values or changed to achieve a desired breakdown voltage of semiconductor element 1000. The number of FLRs in FLR region 152 is ten approximately in the present exemplary embodiment. This number, too, may be changed to achieve a desired breakdown voltage, and, for example, 25 approximately. In terminal edge region 150 including guard ring region 151 and FLR region 152, impurities of the second conduction type have, for example, a maximum concentration of $2 \times 10^{20}$ $cm^{-3}$ approximately and a depth of 1 μm.

The depth of impurities of the second conduction type is defined as described below. Terminal edge region 150 is formed by, for example, ion implantation. In this case, in a plot of the concentration of impurities of the second conduction type from a surface in a depth direction, the concentration has a value defined by an ion implantation condition up to a certain depth. The defined value is higher than the impurity concentration of the first conduction type in drift layer 102. However, the injected ions do not reach a deeper region. Thus, the concentration decreases in the deeper region. Assume that the concentration of the first conduction type in drift layer 102 is constant at, for example, $1 \times 10^{16}$ $cm^{-3}$ in the depth direction. When the concentration of impurities of the second conduction type becomes equal to the impurity concentration of the first conduction type ($1 \times 10^{16}$ $cm^{-3}$) at a certain depth but does not exceed the impurity concentration of the first conduction type ($1 \times 10^{16}$ $cm^{-3}$) in a deeper region, this depth is defined as a depth of impurities of the second conduction type.

In the example illustrated in FIG. 1, barrier regions 153 may have, for example, a width of 3 μm in the in-plane direction of surface 102S of drift layer 102, and may be disposed at an interval of 3 μm to 6 μm approximately. The shape and disposition interval of the barrier region are selected as appropriate to achieve a desired characteristic of the semiconductor element. In addition, in the example illustrated in FIG. 1, terminal edge injection region 154 has, for example, a width of 15 μm in the in-plane direction of surface 102S of drift layer 102, and is disposed separately from FLR region 152.

Figure 8:
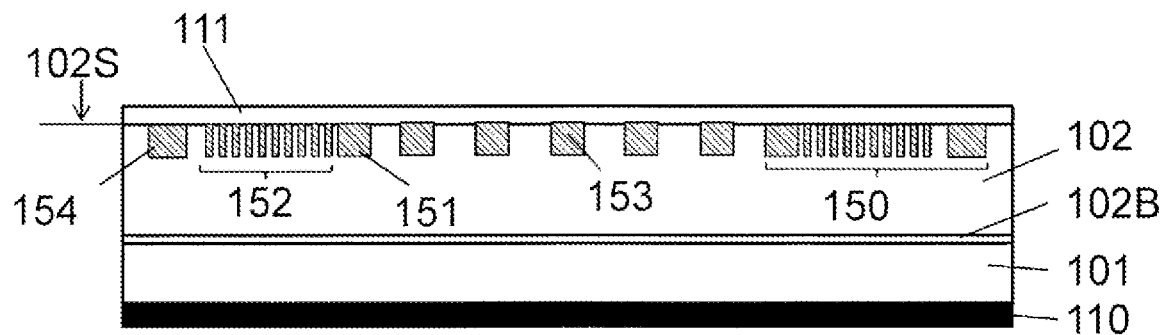
FIG. 8 is a sectional pattern diagram illustrating the method of manufacturing the semiconductor element according to the exemplary embodiment of the present disclosure.

Subsequently, as illustrated in FIG. 8, insulating film 111 made of, for example, $SiO_2$ is formed at a thickness of, for example, 500 nm on surface 102S of drift layer 102 to protect the surface, and then, for example, Ni is deposited at a thickness of 200 nm approximately on the back surface of semiconductor substrate 101 and then thermally processed at 1000° C. approximately to form second electrode 110. Second electrode 110 forms an ohmic contact with the back surface of semiconductor substrate 101. Material of the electrode is not limited to Ni, but may be, for example, Ti or Mo.

Figure 9:
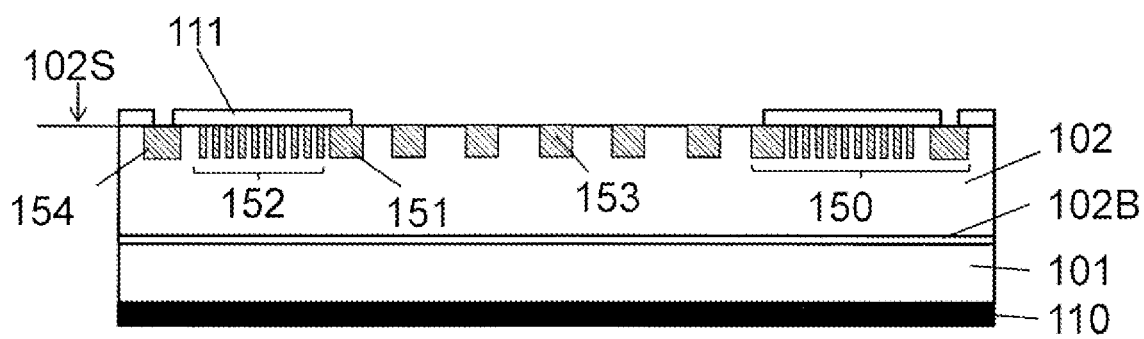
FIG. 9 is a sectional pattern diagram illustrating the method of manufacturing the semiconductor element according to the exemplary embodiment of the present disclosure.

Subsequently, a mask is formed of photoresist, and part of guard ring region 151, drift layer 102 inside guard ring region 151, and part of terminal edge injection region 154 are exposed by, for example, wet etching. Thereafter, the mask is removed. In this manner, insulating film 111 having openings as illustrated in FIG. 9 is obtained.

Figure 10:
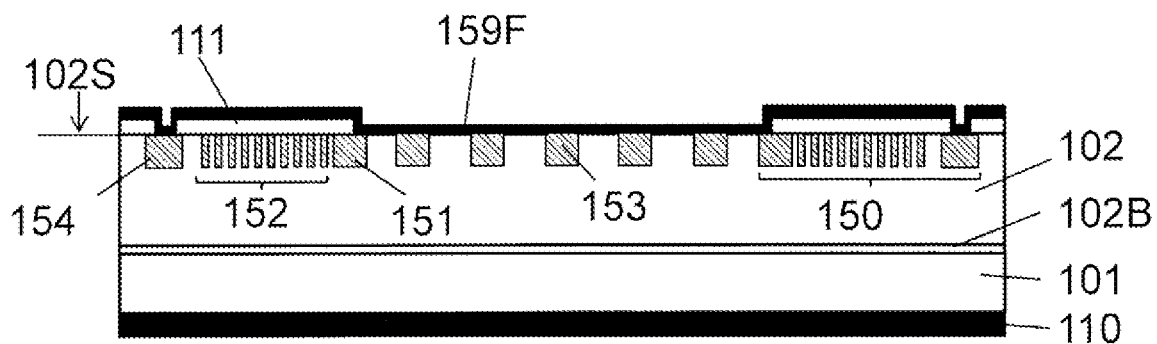
FIG. 10 is a sectional pattern diagram illustrating the method of manufacturing the semiconductor element according to the exemplary embodiment of the present disclosure.

Subsequently, as illustrated in FIG. 10, first-electrode conductive film 159F is deposited to cover an entire surface of insulating film 111 having the openings and drift layer 102 exposed at the openings. First-electrode conductive film 159F may be made of any metal capable of forming a Schottky barrier to drift layer 102. First-electrode conductive film 159F is made of, for example, Ti, Ni, or Mo, and has a thickness of, for example, 200 nm. After the deposition of first-electrode conductive film 159F, semiconductor substrate 101 including first-electrode conductive film 159F is thermally processed at a temperature of 100° C. to 700° C. inclusive. Accordingly, first-electrode conductive film 159F forms a Schottky contact with part of drift layer 102 at which barrier regions 153 and terminal edge injection region 154 are not formed.

Figure 11:
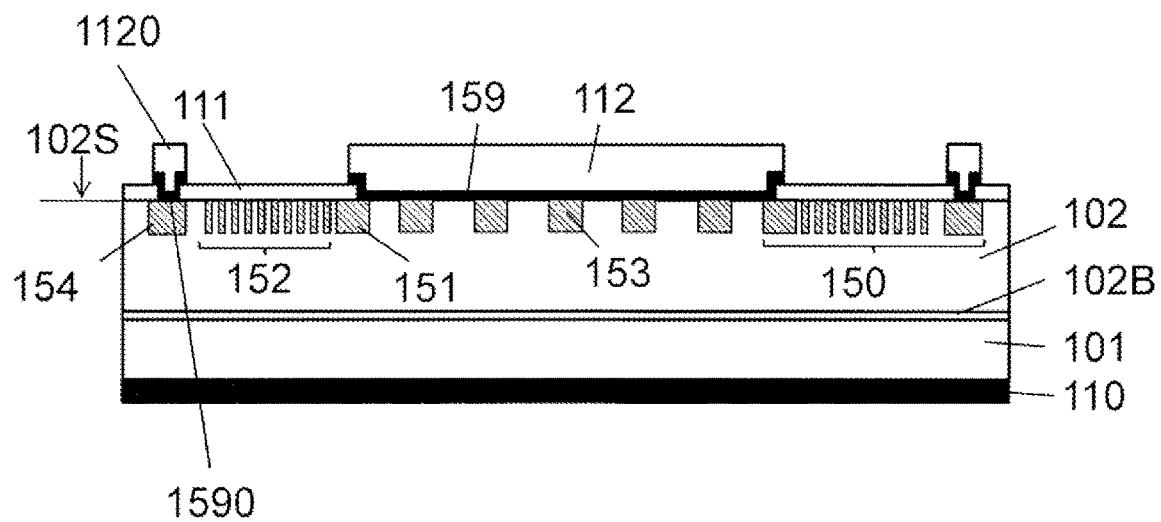
FIG. 11 is a sectional pattern diagram illustrating the method of manufacturing the semiconductor element according to the exemplary embodiment of the present disclosure.

Subsequently, a front-face-electrode conductive film is deposited on first-electrode conductive film 159F. The front-face-electrode conductive film is a metal film containing, for example, Al and having a thickness of 4 μm approximately. Part of first-electrode conductive film 159F is removed by forming a mask on the front-face-electrode conductive film and etching any unnecessary part, thereby exposing part of insulating film 111. The front-face-electrode conductive film and part of first-electrode conductive film 159F are etched and then the mask is removed to form front face electrode 112 and patterned first electrode 159 as illustrated in FIG. 11. In addition, seal ring 1120 and barrier metal 1590 are formed. Etching in this formation may be wet etching or dry etching. Through the formation in this manner, first electrode 159 and barrier metal 1590 have a same configuration, in other words, contain a same material. For example, when first electrode 159 is a metal thin film mainly made of Ti, barrier metal 1590 is a metal thin film mainly made of Ti, too.

Figure 12:
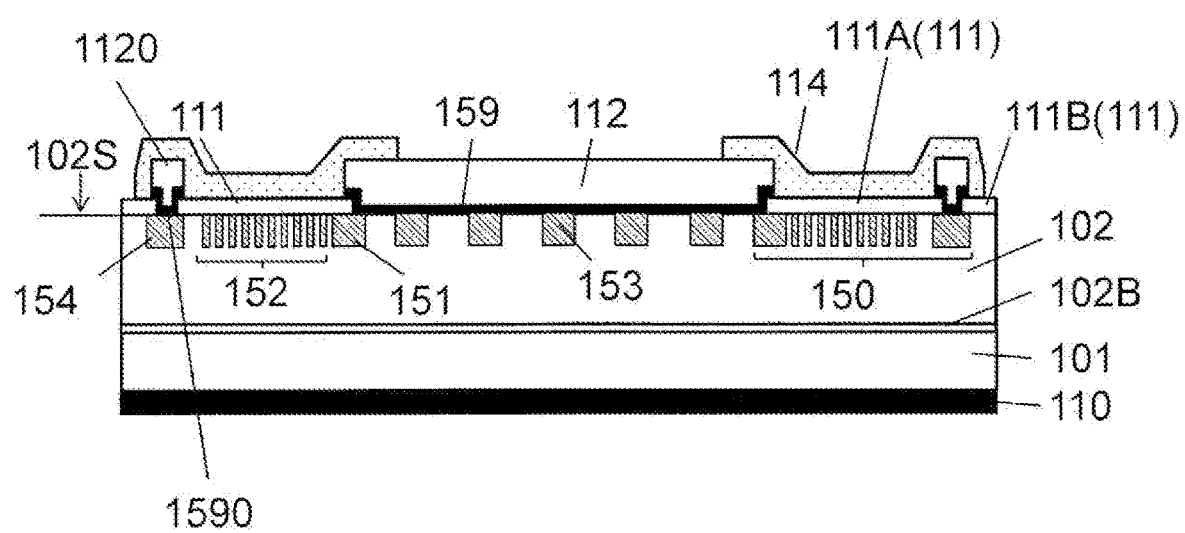
FIG. 12 is a sectional pattern diagram illustrating the method of manufacturing the semiconductor element according to the exemplary embodiment of the present disclosure.

Subsequently, passivation film 114 illustrated in FIG. 12 is formed as necessary. First, exposed insulating film 111 and front face electrode 112 are formed, and in addition, a passivation-film insulating film as an organic film made of, for example, SiN or polyimide is formed on seal ring 1120. Thereafter, a mask having openings through which part of the passivation-film insulating film formed on the part of front face electrode 112, and part of the passivation-film insulating film formed on an end part of outside 111B of insulating film 111 are exposed is prepared. The parts of the passivation-film insulating film are etched through dry etching, wet etching, or development used for the mask, thereby exposing the part of front face electrode 112 and the end part of outside 111B of insulating film 111. Thereafter, the mask is removed. Accordingly, as illustrated in FIG. 12, passivation film 114 having openings at the part of front face electrode 112 and the end part of outside 111B of insulating film 111 is obtained. Passivation film 114 may be any insulator, and, for example, a SiO$_2$ film or an organic film made of, for example, polybenzoxazole. Alternatively, passivation film 114 may be formed as a combination of various insulating films.

Figure 13:
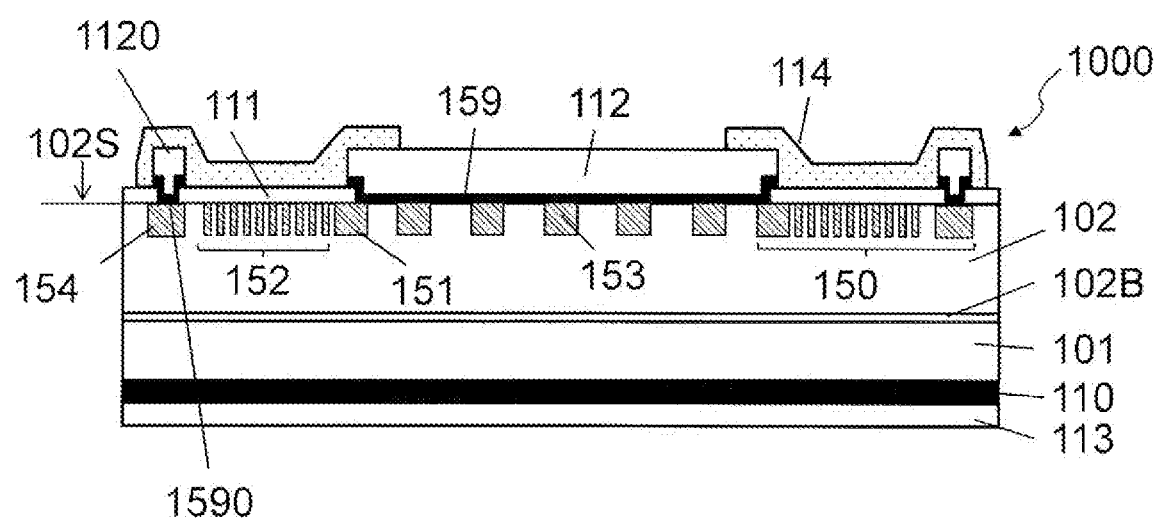
FIG. 13 is a sectional pattern diagram illustrating the method of manufacturing the semiconductor element according to the exemplary embodiment of the present disclosure.

Subsequently, as illustrated in FIG. 13, back face electrode 113 is formed as necessary. A process of forming back face electrode 113 may be performed before the above-described process of forming passivation film 114 or before the process of forming front face electrode 112. In back face electrode 113, for example, Ti, Ni, and Ag are deposited in this order from a side contacting second electrode 110. Thicknesses of Ti, Ni, and Ag are, for example, 0.1 μm, 0.3 μm, and 0.7 μm, respectively. Semiconductor element 1000 is formed through the above-described processes.

Modifications

The following describes modifications of the semiconductor element according to the present exemplary embodiment.

Figure 14:
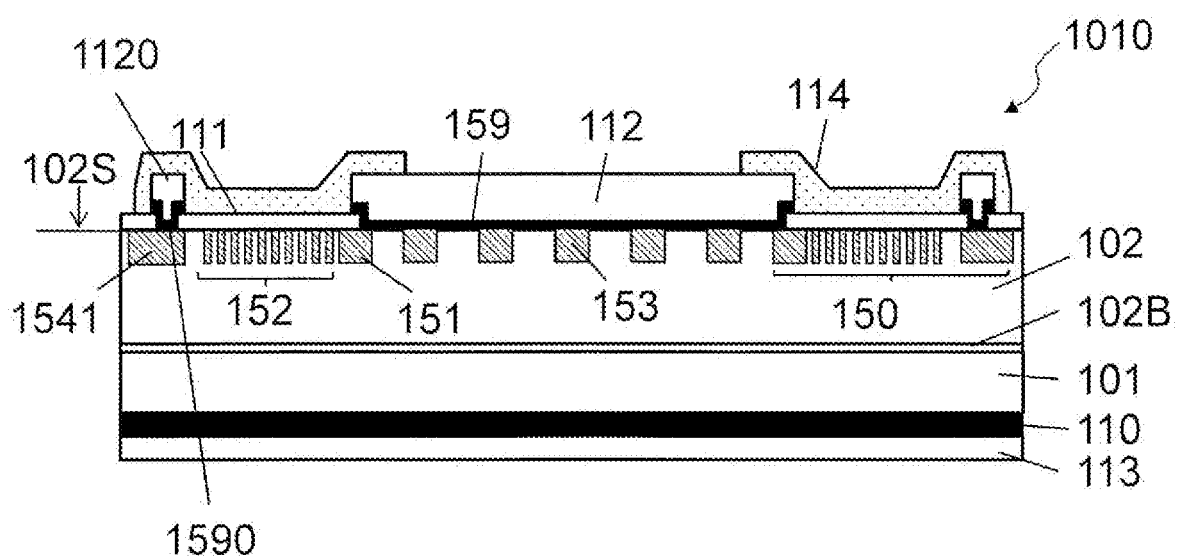
FIG. 14 is a diagram illustrating a section of a semiconductor element according to a modification of the exemplary embodiment of the present disclosure.
Figure 15:
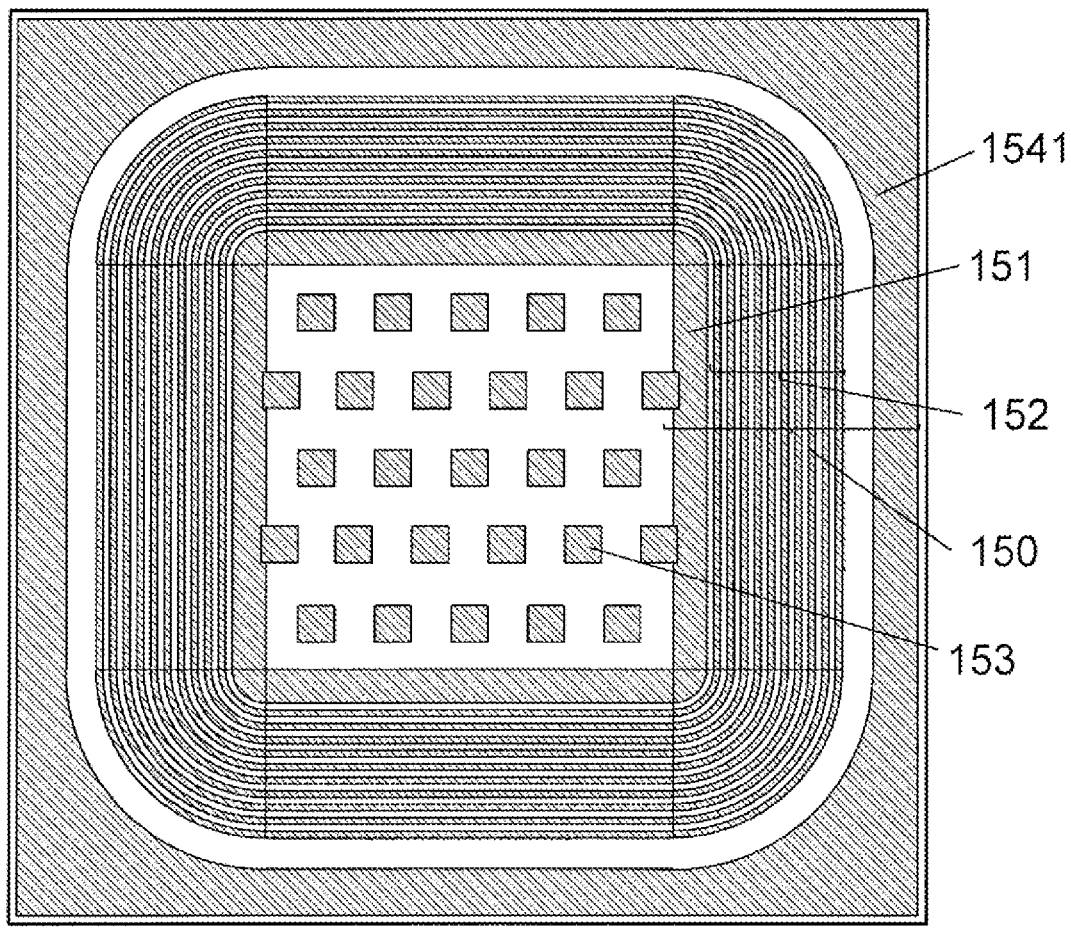
FIG. 15 is a plan view of a terminal edge region and a barrier region formed on a drift layer in the semiconductor element according to the modification of the exemplary embodiment of the present disclosure.

FIGS. 14 and 15 illustrate a cross-sectional view and a plan view, respectively, of semiconductor element 1010 in which terminal edge injection region 154 is extended to the vicinity of the end part of the element unlike semiconductor element 1000 according to the present disclosure. In an example illustrated in FIGS. 14 and 15, the terminal edge injection region is denoted by reference sign 1541. In this example, terminal edge injection region 1541 is extended to the vicinity of the element end part of semiconductor element 1010, but does not reach the element end part. Drift layer 102 of the first conduction type and seal ring 1120 are separated from each other through terminal edge injection region 1541 of the second conduction type. In other words, a region of drift layer 102 of the first conduction type in which terminal edge injection region 154 of the second conduction type is not formed does not contact seal ring 1120.

The potential of terminal edge injection region 154 of the second conduction type is increased by the pn junction between drift layer 102 of the first conduction type and terminal edge injection region 154 of the second conduction type. The potential of seal ring 1120 directly or indirectly contacting terminal edge injection region 154 of the second conduction type is increased, too. Accordingly, the potential difference between seal ring 1120 and drift layer 102 increases as compared to a configuration in which seal ring 1120 directly contacts drift layer 102. This leads to decrease of the potential difference between first electrode 159 and seal ring 1120. In other words, the strength of the electric field generated between first electrode 159 and seal ring 1120 decreases. This results in further reduction of degradation of the humidity resistant performance due to water, impurities, or ions contained in passivation film 114 and insulating film 111 as well as water, impurities, ions, or charged particles trapped at the interface between passivation film 114 and insulating film 111 and the interface between insulating film 111 and drift layer 102. In other words, the separation between drift layer 102 of the first conduction type and seal ring 1120 through terminal edge injection region 154 of the second conduction type improves the humidity resistant performance of semiconductor element 1000.

Figure 16:
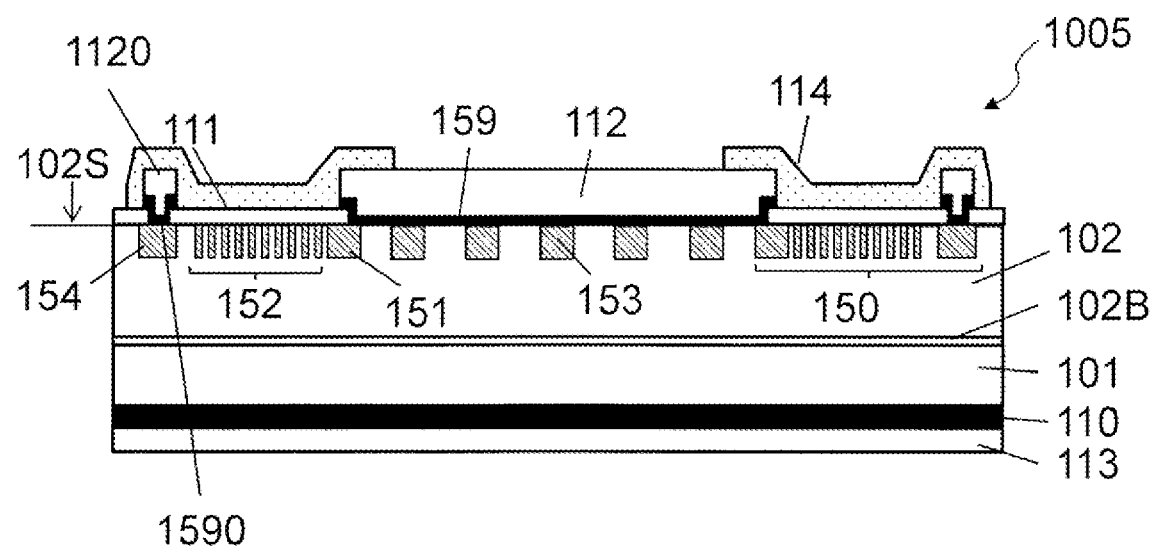
FIG. 16 is a diagram illustrating a section of the semiconductor element according to the modification of the exemplary embodiment of the present disclosure.
Figure 17:
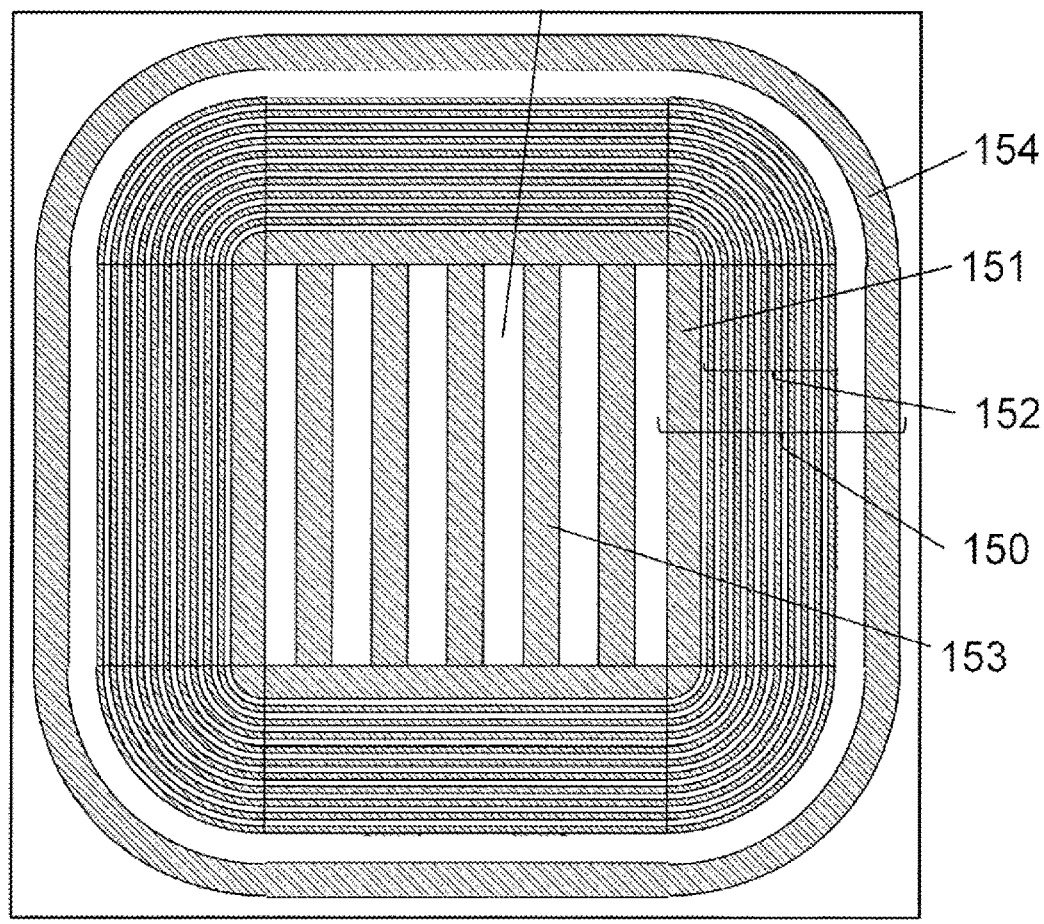
FIG. 17 is a plan view of the terminal edge region and the barrier region formed on the drift layer in the semiconductor element according to the modification of the exemplary embodiment of the present disclosure.

Semiconductor element 1000 according to the present disclosure has a JBS structure including barrier regions 153, the shape of barrier regions 153 may be changed as illustrated in FIGS. 16 and 17. For example, in semiconductor element 1005, barrier regions 153 have a stripe shape extending in one direction in place of a rectangular shape. In such a case, too, the humidity resistant performance can be improved.

Figure 18:
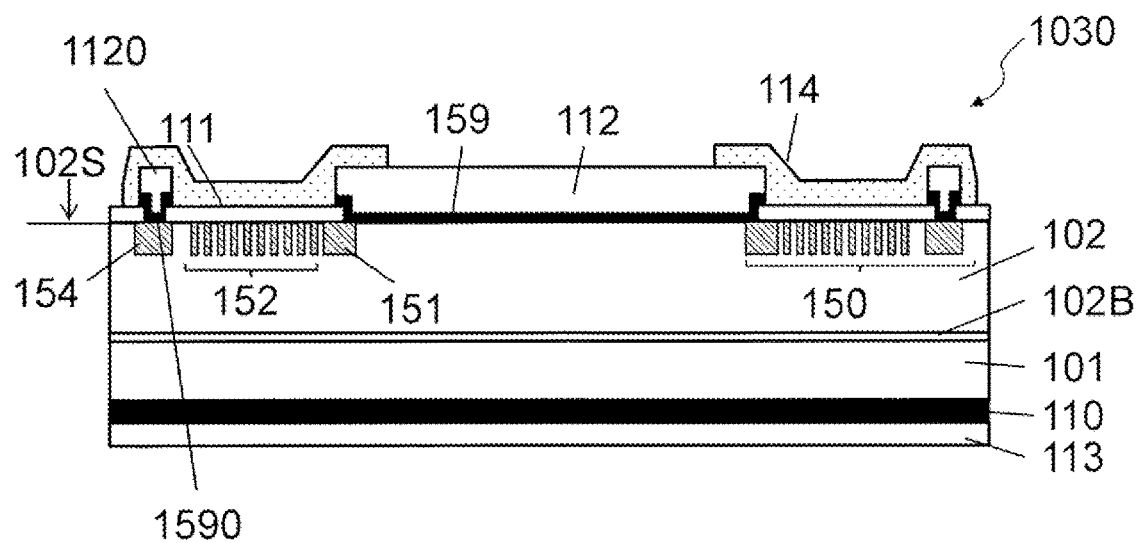
FIG. 18 is a diagram illustrating a section of the semiconductor element according to the modification of the exemplary embodiment of the present disclosure.
Figure 19:
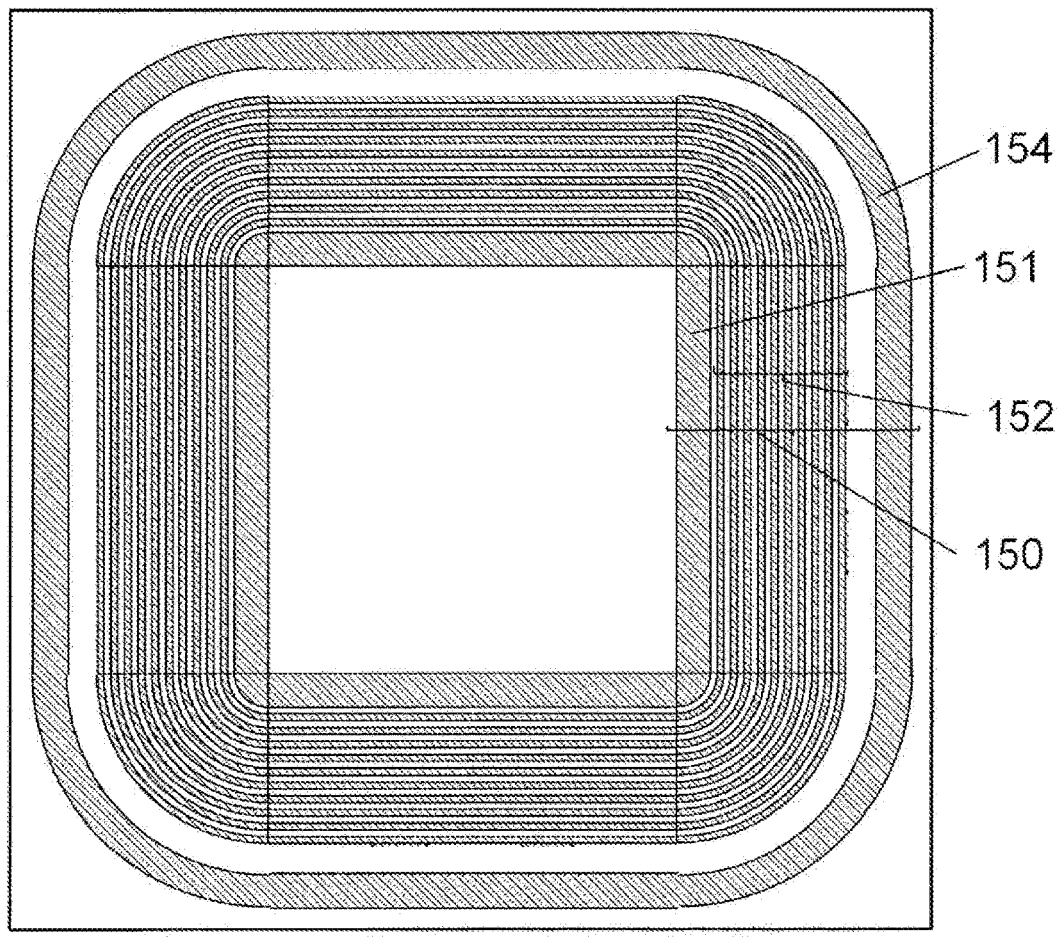
FIG. 19 is a plan view of a terminal edge region formed on drift layer 102 in the semiconductor element according to the modification of the exemplary embodiment of the present disclosure.

Alternatively, as illustrated in FIGS. 18 and 19, no barrier regions 153 may be disposed in semiconductor element 1030. In such a case, too, the humidity resistant performance can be improved.

Figure 20:
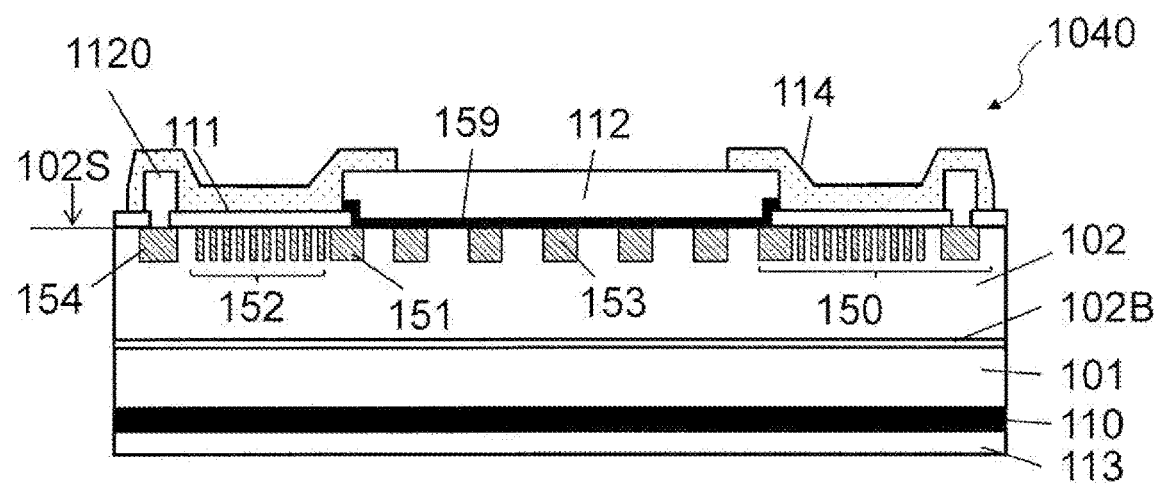
FIG. 20 is a diagram illustrating a section of the semiconductor element according to the modification of the exemplary embodiment of the present disclosure.

In semiconductor element 1040 as illustrated in FIG. 20, no barrier metal 1590 may be disposed below seal ring 1120 so that seal ring 1120 directly contacts terminal edge injection region 154.

Figure 21A:
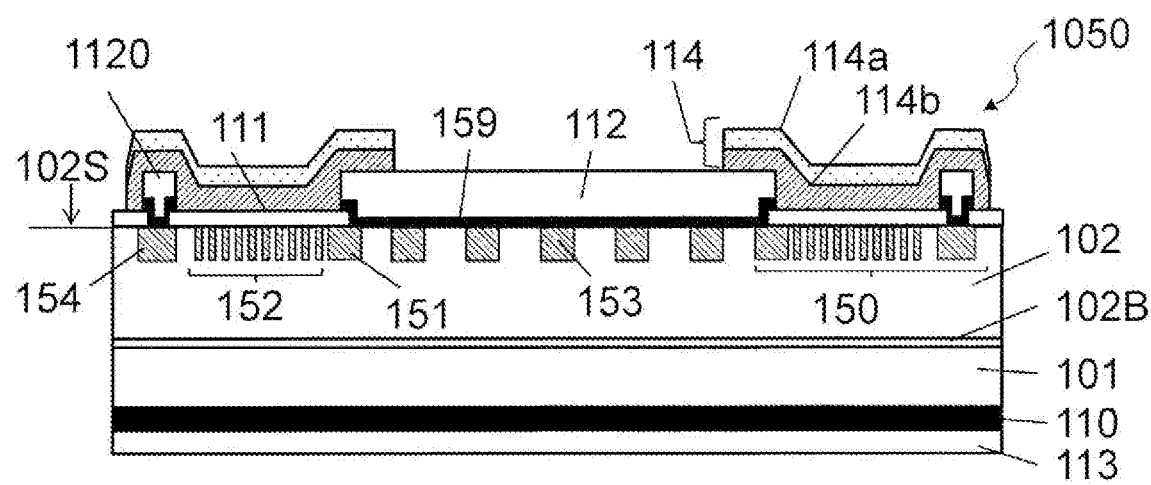
FIG. 21A is a diagram illustrating a section of the semiconductor element according to the modification of the exemplary embodiment of the present disclosure.
Figure 21B:
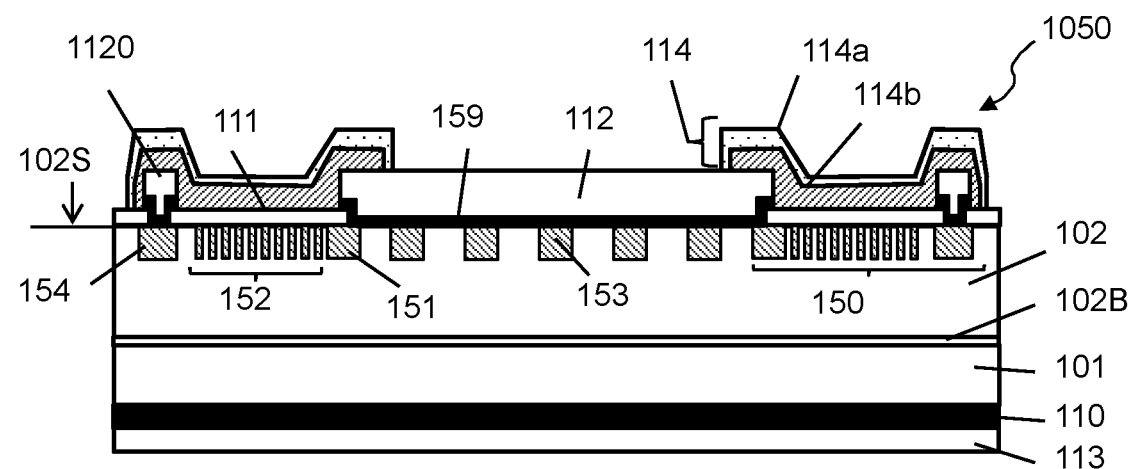
FIG. 21B is a diagram illustrating a section of the semiconductor element according to the modification of the exemplary embodiment of the present disclosure.

Passivation film 114 may have a multi-layer structure as illustrated in FIGS. 21A and 21B. In semiconductor element 1050 illustrated in FIG. 21A, passivation film 114 includes first passivation film 114a and second passivation film 114b. First passivation film 114a is, for example, an organic protective film made of polyimide, and second passivation film 114b is formed of, for example, SiN. As illustrated in FIG. 21B, end part of second passivation film 114b may be disposed inside of first passivation film 114a.

Figure 22:
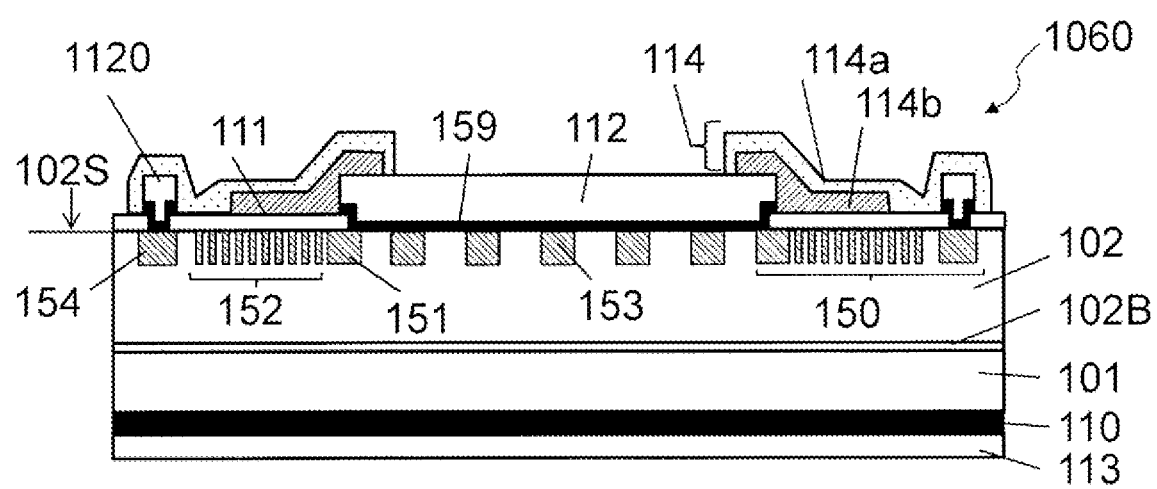
FIG. 22 is a diagram illustrating a section of the semiconductor element according to the modification of the exemplary embodiment of the present disclosure.

As illustrated in FIG. 22, second passivation film 114b may be smaller than first passivation film 114a. In this configuration, second passivation film 114b may cover at least part of terminal edge region 150 through insulating film 111. Second passivation film 114b may cover part of an upper surface of front face electrode 112 or an end face of front face electrode 112.

In a semiconductor element according to the present disclosure, the FLR region is formed as part of a terminal edge structure, but the semiconductor element is not limited to this configuration. For example, the FLR region may be replaced with a JTE region in which the concentration of the second conduction type decreases in the direction pointing from the center to the edge on the plane of the semiconductor substrate. In this case, the JTE region may contact the guard ring region inside or may contact the terminal edge injection region outside.

The configuration and material of each component of the semiconductor element according to the present disclosure are not limited to a configuration and material exemplarily described above. For example, a material of first electrode 159 is not limited to Ti, Ni, and Mo exemplarily described above. First electrode 159 may be made of a material selected from a group consisting of other metals that form a Schottky contact with drift layer 102, and alloys and compounds of the metals.

A barrier film containing, for example, TiN may be formed between first electrode 159 and front face electrode 112. The barrier film has a thickness of, for example, 50 nm.

The exemplary embodiment of the present disclosure describes an example in which silicon carbide is 4H-SiC, but silicon carbide may be another polytype such as 6H-SiC, 3C-SiC, or 15R-SiC. The exemplary embodiment of the present disclosure describes an example in which the principal surface of the SiC substrate is a surface obtained through off-cut from the (0001) surface, but the principal surface of the SiC substrate may be a (11-20) surface, a (1-100) surface, a (000-1) surface, or an off-cut surface of these surfaces may be used as semiconductor substrate 101. A 3C-SiC drift layer may be formed on the Si substrate. In this case, annealing for activating impurity ions injected into 3C-SiC may be performed at a temperature lower than or equal to a melting point of the Si substrate.

The present disclosure is applicable to a power semiconductor device to be mounted on, for example, a consumer, on-board, or industrial electrical power converter.

What is claimed is:

1. A semiconductor element comprising:
   a semiconductor substrate of a first conduction type having a principal surface and a back surface;
   a silicon carbide semiconductor layer of the first conduction type disposed above the principal surface of the semiconductor substrate;
   a terminal edge region of a second conduction type disposed in the silicon carbide semiconductor layer;
   an insulating film covering at least part of the terminal edge region;
   a first electrode disposed on the silicon carbide semiconductor layer and forming a Schottky contact with the silicon carbide semiconductor layer;
   a second electrode disposed on the back surface of the semiconductor substrate and forming an ohmic contact with the semiconductor substrate; and
   a seal ring disposed above the silicon carbide semiconductor layer and surrounds the first electrode,
   wherein the terminal edge region surrounds part of a surface of the silicon carbide semiconductor layer when viewed in a normal direction of the principal surface of the semiconductor substrate,
   the terminal edge region includes a guard ring region of the second conduction type contacting the surface of the silicon carbide semiconductor layer, and a terminal edge injection region of the second conduction type surrounding the guard ring region separately from the guard ring region,
   the first electrode has a surface contacting the silicon carbide semiconductor layer,
   the first electrode contacts the guard ring region at an edge part of the surface contacting the silicon carbide semiconductor layer, and
   the seal ring is disposed above the terminal edge injection region through an opening disposed on the insulating film.

2. The semiconductor element according to claim 1, wherein a width of the seal ring at the opening is smaller than a width of the terminal edge injection region in a direction pointing from a center to an edge on a plane of the semiconductor substrate.

3. The semiconductor element according to claim 1, wherein
   the seal ring includes a conductive film, and
   the seal ring is connected with the terminal edge injection region through the conductive film.

4. The semiconductor element according to claim 3, wherein the terminal edge injection region is disposed entirely in a region with which the conductive film contacts on the surface of the silicon carbide semiconductor layer.

5. The semiconductor element according to claim 1, wherein the seal ring contacts the terminal edge injection region.

6. The semiconductor element according to claim 5, wherein the terminal edge injection region is disposed entirely in a region with which the seal ring contacts on the surface of the silicon carbide semiconductor layer.

7. The semiconductor element according to claim 3, wherein the conductive film has a configuration same as a configuration of the first electrode.

8. The semiconductor element according to claim 1, further comprising a front face electrode disposed on the first electrode.

9. The semiconductor element according to claim 8, wherein the front face electrode has a configuration same as a configuration of the guard ring region.

10. The semiconductor element according to claim 1, wherein
    the terminal edge region further includes an FLR region between the guard ring region and the terminal edge injection region, and
    the FLR region includes a plurality of rings of the second conduction type surrounding the guard ring region separately from the guard ring region.

11. The semiconductor element according to claim 10, wherein the FLR region is disposed separately from the terminal edge injection region.

12. The semiconductor element according to claim 11, wherein the guard ring region, the FLR region, and the terminal edge injection region have an identical concentration profile in a direction perpendicular to the semiconductor substrate.

13. The semiconductor element according to claim 12, wherein concentration of impurities of the second conduction type in the silicon carbide semiconductor layer is more than or equal to $1 \times 10^{20}$ cm$^{-3}$ in the guard ring region, the FLR region, and the terminal edge injection region.

14. The semiconductor element according to claim 1, further comprising a barrier region of the second conduction type disposed on the surface of the silicon carbide semiconductor layer inside the guard ring region.

15. The semiconductor element according to claim 10, further comprising a barrier region of the second conduction type disposed on the surface of the silicon carbide semiconductor layer inside the guard ring region,
    wherein the barrier region, the guard ring region, the FLR region, and the terminal edge injection region have an identical concentration profile in a direction perpendicular to the semiconductor substrate.

16. The semiconductor element according to claim 15, wherein concentration of impurities of the second conduction type in the silicon carbide semiconductor layer is more than or equal to $1 \times 10^{20}$ cm$^{-3}$ in the barrier region, the guard ring region, the FLR region, and the terminal edge injection region.

17. A method of manufacturing a semiconductor element, the method comprising:
- preparing a semiconductor substrate of a first conduction type having a principal surface and a back surface;
- forming a silicon carbide semiconductor layer of the first conduction type disposed on the principal surface of the semiconductor substrate;
- forming a terminal edge region of a second conduction type disposed in the silicon carbide semiconductor layer;
- forming an insulating film covering at least part of the terminal edge region;
- forming a first electrode disposed on the silicon carbide semiconductor layer to form a Schottky contact with the silicon carbide semiconductor layer;
- forming a second electrode disposed on the back surface of the semiconductor substrate and functioning as an ohmic contact with the semiconductor substrate; and
- forming a seal ring disposed on the silicon carbide semiconductor layer to surround the first electrode,
- wherein the terminal edge region is disposed to surround part of a surface of the silicon carbide semiconductor layer when viewed in a normal direction of the principal surface of the semiconductor substrate,
- the terminal edge region includes a guard ring region of the second conduction type contacting the surface of the silicon carbide semiconductor layer, and a terminal edge injection region of the second conduction type disposed to surround the guard ring region separately from the guard ring region,
- the first electrode has a surface contacting the silicon carbide semiconductor layer,
- the first electrode contacts the guard ring region at an edge part of the surface contacting the silicon carbide semiconductor layer,
- the seal ring is formed on the terminal edge injection region through an opening formed on the insulating film, and
- the guard ring region and the terminal edge injection region are formed through an identical process.

18. The method of manufacturing a semiconductor element according to claim 17, further comprising forming an FLR region disposed between the guard ring region and the terminal edge injection region and including a plurality of rings of the second conduction type disposed to surround the guard ring region separately from the guard ring region,
- wherein the guard ring region, the FLR region, and the terminal edge injection region are formed through an identical process.

19. The method of manufacturing a semiconductor element according to claim 18, further comprising forming a barrier region of the second conduction type disposed on the surface of the silicon carbide semiconductor layer inside the guard ring region,
- wherein the barrier region, the guard ring region, the FLR region, and the terminal edge injection region are formed through an identical process.

20. The method of manufacturing a semiconductor element according to claim 17, wherein
- the seal ring is indirectly connected with the terminal edge injection region through a conductive film, and
- the conductive film is formed through a process identical to a process through which the first electrode is formed.

21. The method of manufacturing a semiconductor element according to claim 17, further comprising forming a front face electrode disposed on the first electrode,
- wherein the front face electrode is formed through a process identical to a process through which the seal ring is formed.

* * * * *